United States Patent [19]

Choi

[11] Patent Number: 6,084,807

[45] Date of Patent: Jul. 4, 2000

[54] MEMORY DEVICE WITH GLOBAL REDUNDANCY

[76] Inventor: Jin H. Choi, 1665-23 Seocho-dong Seocho-gu, Seoul, Rep. of Korea

[21] Appl. No.: 09/436,071

[22] Filed: Nov. 8, 1999

[51] Int. Cl.[7] .................................................... G11C 7/00
[52] U.S. Cl. ................ 365/200; 365/225.7; 365/230.03; 365/205; 365/230.06; 365/233
[58] Field of Search ................................ 365/200, 225.7, 365/230.03, 205, 230.06, 233

[56] References Cited

U.S. PATENT DOCUMENTS

| | | | |
|---|---|---|---|
| 4,718,041 | 1/1988 | Baglee et al. | 365/185.22 |
| 4,763,305 | 8/1988 | Kuo | 365/200 |
| 5,687,108 | 11/1997 | Proebsting | 365/51 |

Primary Examiner—Andrew Q. Tran

[57] ABSTRACT

A memory device with global redundancy repair architecture and method of employing same. In the memory device containing blocks of normal memory cells, redundant cells are assembled in one block called a special block. One or more sense amplifiers are coupled to each block, including the special block. The sense amplifiers connected to the special block are not shared between the special block and a neighboring normal block or any other normal block. Addresses of defective cells are stored in fuse boxes that assign the defective address to a repair cell within the special block. The fuse boxes can assign any normal cell in the array to a repair cell in the special block. In the method, a selected memory block is operated whether the selected word line needs repair or not without waiting for a comparison signal from the fuse box. The special block is always operated as if it is selected. If a block adjacent the special block is selected, there is no problem since the special block does not share a sense amp with adjacent blocks. Since the block containing the repair cells is always turned on, toggling of the sense amps and consequent current is greatly reduced.

19 Claims, 8 Drawing Sheets

MEMORY DEVICE WITH GLOBAL REDUNDANCY

BACKGROUND OF THE INVENTION

The present invention relates in general to semiconductor memories, and in particular to a memory circuit with global redundancy.

Memory circuits such as dynamic random access memories (DRAMs) are made up of a large number of memory cells located at the cross section of word lines (or rows) and bit lines (or columns). The memory cells are typically arranged in separate arrays with separate row and column decoders that decode the address of a selected memory cell. FIG. 1 shows a simplified example of an architecture for a prior art random access memory. In this typical prior art example, the memory arrays 100 are stacked on either sides of the global column decoder 102. Sense amplifiers 104 are disposed in between the memory arrays 100, and are typically shared by two adjacent memory arrays 100. Power is supplied to the sense amplifiers 104 by power buses 110 that branch off a wide metal bus extending from the power pad 112 down the side of the array. A row decoder 106 is disposed at the end of each memory array 100.

FIG. 2 shows a typical array of memory cells for a dynamic random access memory (DRAM). Memory cell array 200 includes an access transistor 202 that connects a storage capacitor 204 to a bit line. A word line 206 within a given array connects to the gate terminals of access transistors of a plurality of memory cells 200. When a particular word line 206$i$ is selected, all access transistors 202 connected to the row line turn on, allowing charge sharing to occur between the bit line parasitic capacitance 210 and the memory cell storage capacitor 204. A sense amplifier detects the increase or decrease in bit line voltage from the memory cell and drives the complementary bit lines to full logic levels, e.g., $V_{ss}$ corresponding to a logical "0" and $V_{DD}$ corresponding to a logical "1", depending on the original voltage of stored in the memory cell. A selected column (i.e., bit line) decoder then connects a selected pair of bit lines to the I/O lines as described in connection with FIG. 1. The circuit further includes programmable redundant word line decoders (not shown) that select redundant rows 208. When a word line 206 is found to be defective, redundant row decoders are programmed such that when the defective row is addressed, a redundant word line 208 is selected.

In a typical DRAM, a die containing memory cell arrays of the type shown in FIG. 2 is generally divided into 2, 4, or more banks. Each bank is divided into several (e.g. 16) block arrays. The location of each memory cell is defined by a unique address that typically identifies a bank, a block within the bank and a particular row and column in that block The memory circuit includes row and column decoders that decode different combinations of signals at an address input to the memory circuit. To improve the speed of operation, all bit lines in the DRAM are typically pre-charged to a predetermined level, for example, one half the power supply (½ Vcc). This is usually accomplished by equalizing the potential on a pair of complementary bit lines. In a typical implementation, equalization is performed at a block level where a block equalizer circuit pre-charges all bit lines within a block to ½ Vcc. To improve the speed of operation, normally performed prior to read or write operations.

Ideally, the die containing the memory device is flawless, i.e., none of the memory cells in the die is defective. Unfortunately, it not infrequently happens that some small number of the memory cells in the die suffer from some manner of defect. Such defects often occur as a result of contaminant particles that land on the die during manufacture. Since the expense of making the die is considerable, it is undesirable to throw away a die having only a few defective memory cells, if these cells can be repaired at a lower cost than that of a new die. A memory device containing repaired cells will function adequately, though generally such a repaired memory device operates slower than a flawless device and is, therefore, less valuable. Although less valuable than a flawless memory device, a repaired memory device can still be sold thereby recovering some or all of the costs of manufacture.

Memory circuits provide for redundancy by including on the same circuit several duplicate rows and/or columns of memory cells, to replace rows or columns having defective memory cells. Separate decoders are provided for the redundant rows or columns that are programmable using programming elements such as fusible links. Once the integrated circuit is tested and the locations of the defective memory cells are determined, the programmable redundancy decoders are programmed to decode those addresses that correspond to the rows or columns with defective cells. The defective rows or columns are subsequently disabled. This way every time a defective row or column is addressed, a redundant equivalent is selected instead.

Redundancy typically operates as follows. According to the address of the memory cell, a given bank, a given block within that bank, and a given word line within the block are selected. The block operation is typically in the following sequence. The block equalizer is turned off, sense amplifiers are connected to the selected block and the selected word line is enabled to go high. To determine if the addressed word line includes defective cells that address is compared with the preprogrammed fuse box data. If the address is that of a defective cell, the redundancy decoder enables a redundant word line to replace the normal word line with the defective cell(s). The address comparison consumes some time to determine whether or not the memory cell at the given address needs repair. In general this comparison occurs after the block is selected and before the word line is enabled.

FIG. 3($a$) shows a typical prior art local repair architecture for a bank of memory cells in a DRAM. The bank 300 contains a plurality of blocks $302_0$–$302_{15}$, sense amps $304_0$–$304_{16}$, fuse boxes $306_0$–$306_{31}$, and redundant arrays $308_0$–$308_{15}$. Note that a redundant array is assigned to each block. Each block $302_i$ contains a number of (e.g., 512) normal word lines. Each redundant array $308_i$ contains a smaller number of (e.g., four) repair word lines. Bank 300 also contains plurality of bit lines (not shown) that are shared by each block $302_i$ and each redundant array $308_i$. Any given block $302_n$ shares at least one sense amp $304_i$ with a neighboring block $302_{n+1}$ as shown in FIG. 3($b$). Sense amp $304_i$ is coupled to blocks $302_n$ and $302_{n+1}$ by transistors $305_n$ and $305_{n+1}$. Transistors $305_n$ and $305_{n+1}$ are activated by control lines bish and bisl. The sense amp $304_i$ can only be connected to one block at a time. Consequently bish and bisl must be logical complements of each other. To simplify the repair algorithm and reduce the time delay, redundant arrays $308_0$–$308_{15}$ containing repair cells are placed in each block $302_i$. This way, the fuse boxes $306_i$ need not contain block address data. Furthermore, every block $302_i$ can operate whether a selected row address is repaired or not. Each redundant array $308_i$ typically contains four redundant word lines. Fuse boxes $306_i$ are configured such that any given block shares four fuse boxes with one of its neighboring blocks. For example, block $302_i$ shares fuse boxes $306_0$–$306_3$ with block $302_0$ but not with block $302_2$.

In general a local repair architecture has more redundant word lines than fuse boxes. For instance, the local repair architecture depicted in FIG. 3 has two fuse boxes $306_i$ per block, but 4 redundant word lines $308_i$ per block. Thus, because there are 4 redundant word lines and each block shares four fuse boxes with a neighboring block, a maximum of 4 failed word lines can be replaced per block. However, since fuse boxes are only shared between neighboring blocks, a fuse box cannot directly map any given redundant word line to any given block.

This type of local redundancy can cause repair inefficiency. For example, bank 300 contains sixteen blocks and thirty-two fuse boxes. Each block array $302_i$ contains, for example, 512 normal word lines and four redundant word lines (i.e., repair lines). Up to 32 failed word lines in bank 300 can be repaired since there are only 32 fuse boxes. However, there are 64 redundant word lines in bank 300. Thus, at best half of the redundant word lines are useless. Furthermore, repair is impossible if the number of failed memory cells in any block $302_i$ exceeds the number of redundant word lines for that block. In the present example, if any one block $302_i$ contains 5 defective word lines, the whole DRAM containing bank 300 ends up defective and must be thrown away even though there are far more fuse boxes $306_i$ than defective cells. As the memory density of the DRAM increases the repair of defective cells becomes even more problematic since the fuse boxes $306_i$ take up a finite amount of space and are difficult to fit into the array pitch. Furthermore, it is possible that one or more repair word lines and/or one or more fuse boxes may fail.

To increase repair efficiency, the prior art has developed global redundancy for memory cells. Global redundancy allows the redundant memory cells to replace failed cells in any block. The architecture for such a global redundant repair scheme is depicted in FIG. 4. A bank 400 of memory cells contains blocks $402_0$–$402_{15}$, sense amps $404_0$–$404_{15}$, and fuse boxes $406_0$–$406_{31}$. Only one block, typically block $402_{15}$, contains the redundant word lines. While this type of global repair architecture eliminates the inefficiencies associated with local redundancy schemes, it tends to introduce a timing disadvantage because the block address must also be decoded. Specifically, to replace any word line in any block, the block must be selected after comparing the address data with the fuse box data. If the selected word line is normal the selected block operates normally. If the selected word line must be repaired, the block containing the repair cells is activated instead. Another drawback with this type of global redundancy is increased current dissipation when the selected block is adjacent the block containing the repair cells (i.e., block $402_{14}$ in this case). The sense amplifiers shared by blocks $402_{14}$ and $402_{15}$, i.e., sense amps $404_{15}$ cannot be connected to blocks $402_{14}$ and $402_{15}$ simultaneously. Consequently, the control lines coupling the shared sense amps $404_{15}$ between blocks $402_{14}$ and $402_{15}$ must be continually toggled on and off. The toggling may undesirably consume a large portion of the operating current if a large number of sense amps, e.g. 8196 for a 256M DRAM, is activated. Thus, there is a need in the art for an efficient global repair mechanism that reduces time delays and consumption of current.

SUMMARY OF THE INVENTION

The disadvantages associated with the prior art are overcome by a memory device with improved global redundancy. The device generally comprises a plurality of blocks of memory each block having an array of normal memory cells. One block of the plurality, called a special block, further includes an array of redundant memory cells. The redundant memory cells can replace defective normal memory cells in any one of the plurality of memory blocks, including the special block. A plurality of banks of sense amplifiers are disposed adjacent the plurality of blocks of memory. The sense amps are coupled to the plurality of blocks of memory such that, except for the special block, blocks in the plurality share a bank of sense amplifiers with an adjacent block. The special block, by contrast, is coupled to one or more dedicated banks of sense amplifiers that are not shared with any other block.

The normal and redundant memory cells in the device are typically arranged in a plurality normal and redundant word lines as well as a plurality of bit lines. Word line and bit line decoders assign a particular bit of data to a memory cell located at an address corresponding to the intersection of a word line and a bit line. In one embodiment, the block that includes the redundant array, i.e., the special block, is the block closest to the column, i.e. bit line, decoder. Addresses of defective cells are programmed in fuse boxes that assign the defective address to a redundant word line or bit line within the redundant array. The fuse boxes can map any normal cell in the array to a repair cell in the redundant array.

A device of the type described above can be implemented according to an inventive method. In the method, an input address signal is decoded to determine whether the address is in the special block and if the input address includes a defective memory cell. The special block is activated whether the input address is in the special block or not. If the input address selects a block other than the special block the selected normal block is activated. If the decoded address includes a defective memory cell the normal block is set to a pre-charge state and a read or write operation is performed on one or more of the redundant memory cells in the special block. If the decoded address does not include a defective memory cell, the special block is set to a pre-charge state and a read or write operation is performed on one or more of the normal memory cells in the selected normal block. Note that if the selected address is within the special block, only the special block is selected. On the other hand, if a block adjacent the special block is selected, there is no problem since the memory block with redundancy array does not share a sense amp with adjacent blocks. Furthermore since the block containing the repair cells is always turned on, toggling of transistors connected to the sense amps (bish/bisl in FIG. 3b) and consequent current is greatly reduced.

The global redundancy described above may be implemented by providing a plurality of blocks of memory, including a special block and coupling a plurality of banks of sense amplifiers to the plurality of blocks such that, except for the special block, other blocks in the plurality share a sense amplifier with an adjacent block.

The following detailed description and drawings provide a better understanding of the nature and advantages of the global redundancy architecture embodied in the device and method described above.

DESCRIPTION OF THE SPECIFIC EMBODIMENTS

Figure 1:
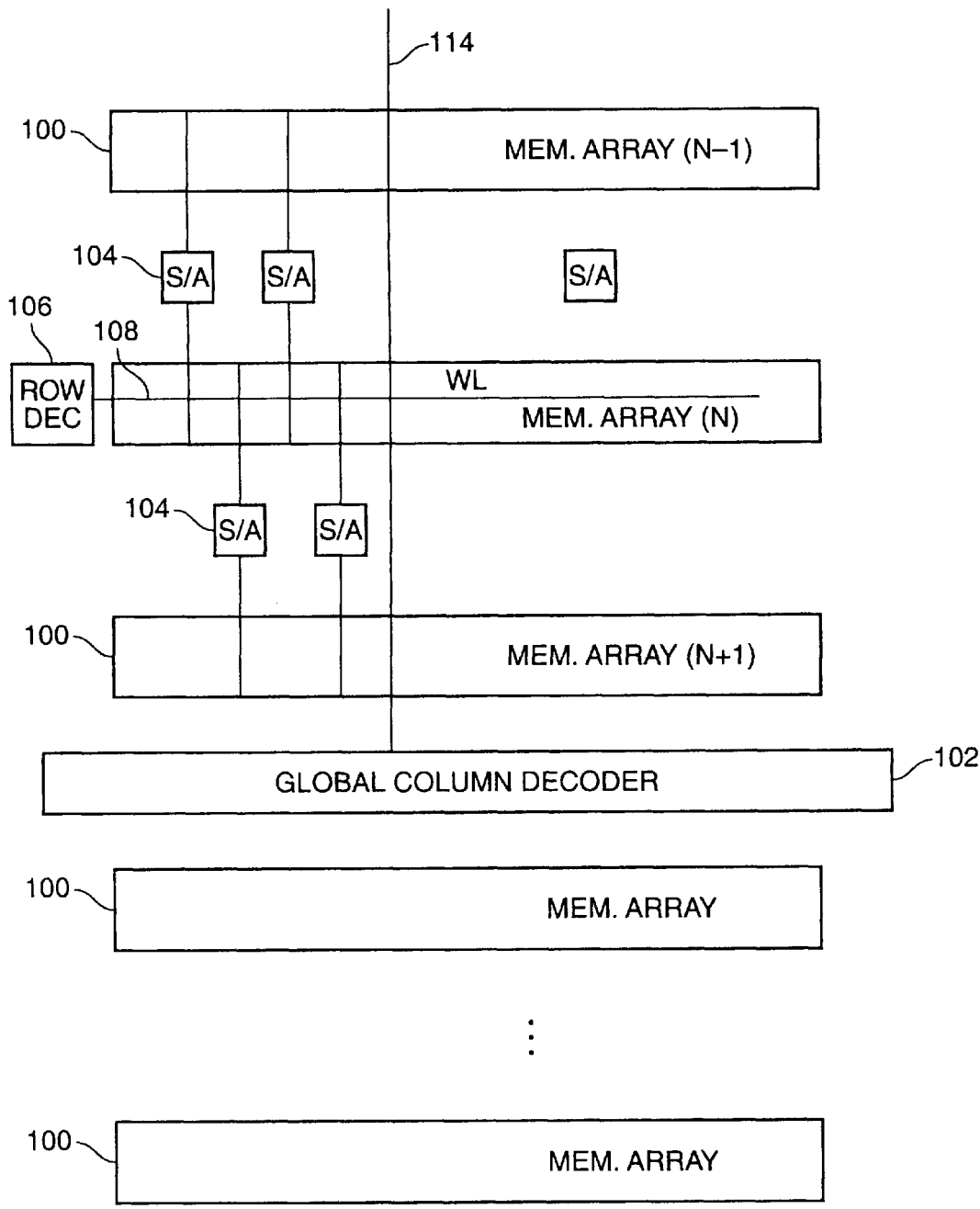
FIG. 1 depicts a block diagram of a simplified example of an architecture for a random access memory of the prior art.
Figure 2:
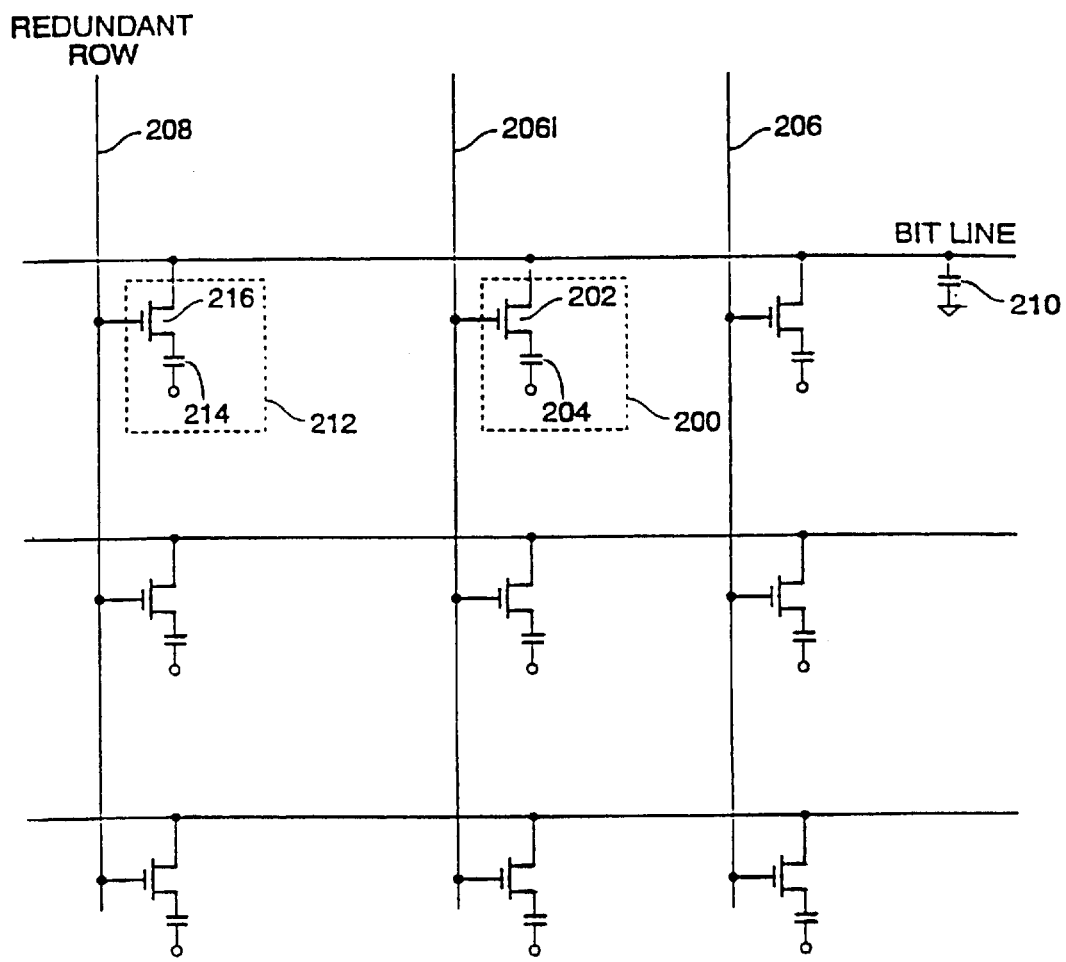
FIG. 2 depicts a schematic diagram of a typical array of memory cells for a DRAM.
Figure 5A:
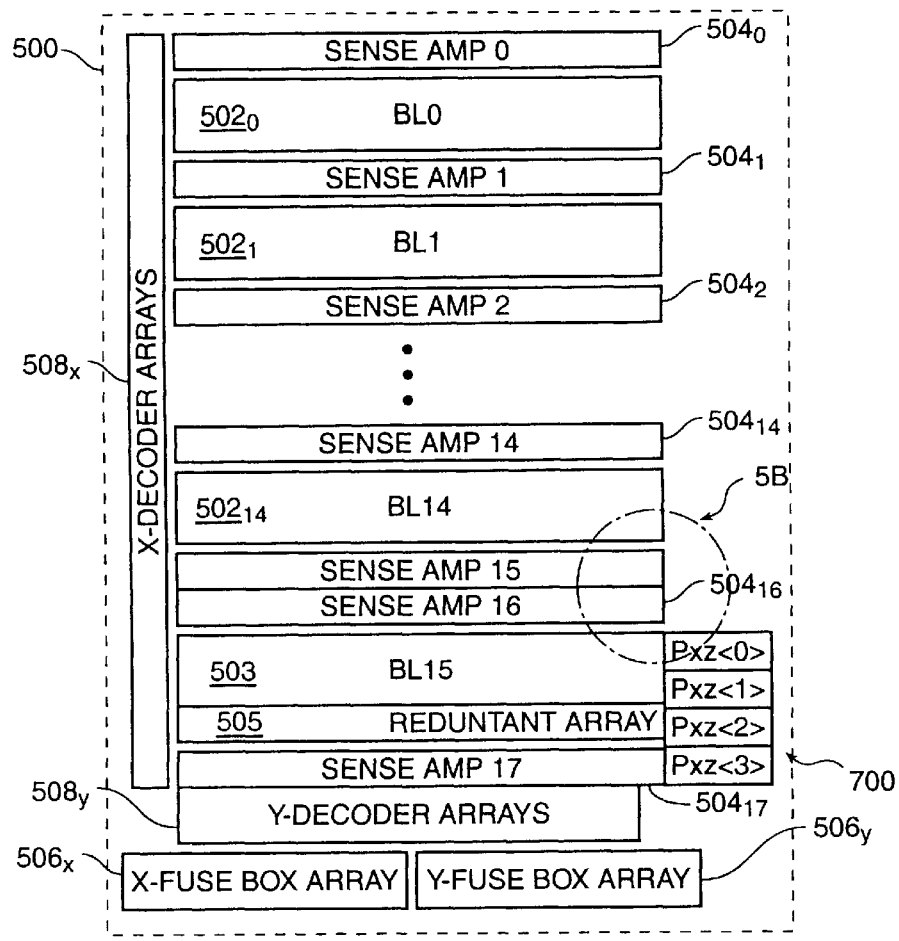
FIG. 5(a)–5(b) depict a block diagram of a DRAM exhibiting a global repair architecture according to an exemplary embodiment of the present invention.
Figure 5B:
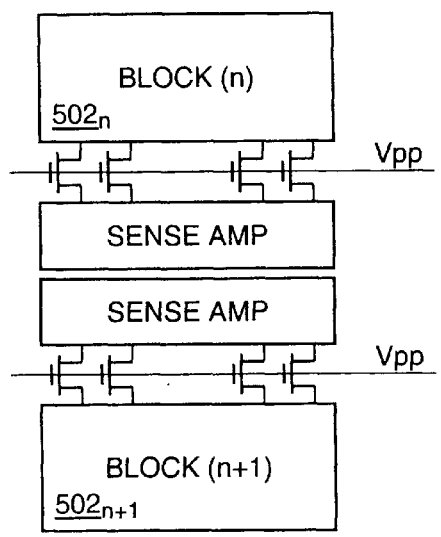

An embodiment of an architecture for global redundancy according to the present invention is depicted in FIG. 5, which depicts one bank 500 of memory cells in a memory device that typically includes several such banks. In this example, memory cells in bank 500 are divided into 16 blocks $502_0$–$502_{15}$, the last one of which ($502_{15}$), referred to herein as a special block, also includes an array 505 of redundant cells. The redundancy array 505 may be included in any one of the blocks $502_0$–$502_{15}$, but in a preferred embodiment it is located in block $502_{15}$ which is closest to a column decoder $508_Y$. Blocks $502_0$–$502_{15}$, may contain memory cells such as those of the type depicted in FIG. 2 and may be further divided into sub-blocks. Bank 500 further includes banks of sense amplifiers $504_0$–$504_{17}$, a row or X Fuse Box array $506_X$, a and column or Y-Fuse Box array $506_Y$. Furthermore, one or more block equalizers (not shown) in blocks $502_i$ provide for pre-charge mechanism prior to read or write operations. Repair cells 505 in special block $502_{15}$ can selectively repair defective cells in any of the 16 blocks $502_i$ via information contained in fuse box arrays $506_X$ and $506_Y$. X-Fuse Box array $506_X$ and Y-Fuse Box array $506_Y$ generally contain a number of fuse boxes and repair circuits. Bank 500 further contains an X-address (i.e., row or word line) decoder array $508_X$ coupled to the 16 memory blocks $502_0$–$502_{15}$ as well as the X-Fuse box $506_X$ and a Y-address (i.e., column or bit line) decoder array $508_y$ coupled to the 16 memory blocks $502_0$–$502_{15}$ as well as the X-Fuse box $506_X$.

The exemplary embodiment shown in FIG. 5 provides 18 banks of sense amplifiers $504_i$ that connect to the memory blocks $502_i$ a follows: Sense amplifier $504_0$ is connected to block $502_0$ only. Each one of sense amplifier banks $504_1$ to $504_{14}$ is shared by the memory blocks on either side (i.e., sense amps in bank $504_2$ are shared by memory blocks $502_0$ and $502_1$, sense amps in bank $504_2$ are shared by blocks $502_1$ and $502_2$, . . . sense amps in bank $504_{14}$ are shared by blocks $502_{13}$ and $502_{14}$). Sense amps in bank $504_{15}$ connect to memory block $502_{14}$ only. Special memory block $502_{15}$ has dedicated banks of sense amplifiers $504_{16}$ and $504_{17}$ on either side that are not shared with any other block.

In a specific embodiment of the repair architecture according to the present invention, repair cells 505 in special block $502_{15}$ are arranged in several, (e.g. 4, 8, 16, 32, or any arbitrary number) rows, i.e., there are several redundant word lines. In principle, any number redundant word lines is possible. Multiples of 4 (4, 8, 12, 16 etc.) are common because of sub word line operation. Preferably, special block $502_{15}$ is the block closest to Y decoder $508_Y$ to compensate somewhat for slower (i.e., longer) bit lines in that block. That is, because special block $502_{15}$ is larger due to the addition of the redundant array, the bit lines are longer and therefore a little slower than the bit lines in other blocks. Placing the larger block ($502_{15}$) closer to the column decoder $508_Y$ therefore, compensates somewhat for the additional delay in block $502_{15}$. Although special block $502_{15}$ is described and depicted herein as being at an end of the array of blocks, the present invention is in no way limited to this particular layout. Furthermore, special block $502_{15}$ may contain any suitable number of redundant word lines.

According to another aspect of the present invention, unlike the prior art where a complex address-mapping scheme is required to map addressing several redundant word lines using fewer fuse boxes, the present invention provides for direct mapping of addresses that use the redundancy. Specifically, the global repair architecture according to the present invention assigns each redundant word line directly assigned to each fuse box and does not require block assignment of the redundant word lines. Therefore, it does not matter where a failed memory cell is located. Furthermore, if a given redundant word line fails, then the fuse box belonging to that redundant word line is simply not used. If, after repair, it is discovered that the fuse box is also defective then it can be replaced by wiring another redundant word line to the failed cell via another fuse box.

The repair scheme associated with the architecture described herein is implemented as follows. After manufacture, the memory device containing bank 500 is tested for defective normal cells, defective redundant cells, and defective fuse boxes. Assuming the number of defective cells tested is less than or equal to the number of available repair cells, the address of each defective cell is programmed into the redundant circuitry, e.g., by blowing appropriate fuses in the X-Fuse Box $506_X$ and/or the Y Fuse Box $506_Y$. When address decoder arrays $508_X$ and $508_Y$ receive an address, the addressed block is turned on. If the addressed block is not special block $502_{15}$, then block $502_{15}$ is also turned on. If the address selects a defective cell, as determined by the information on the fuse boxes, then the normal word line is disabled and the appropriate redundant word line is enabled so that information may be either stored or retrieved.

Figure 6:
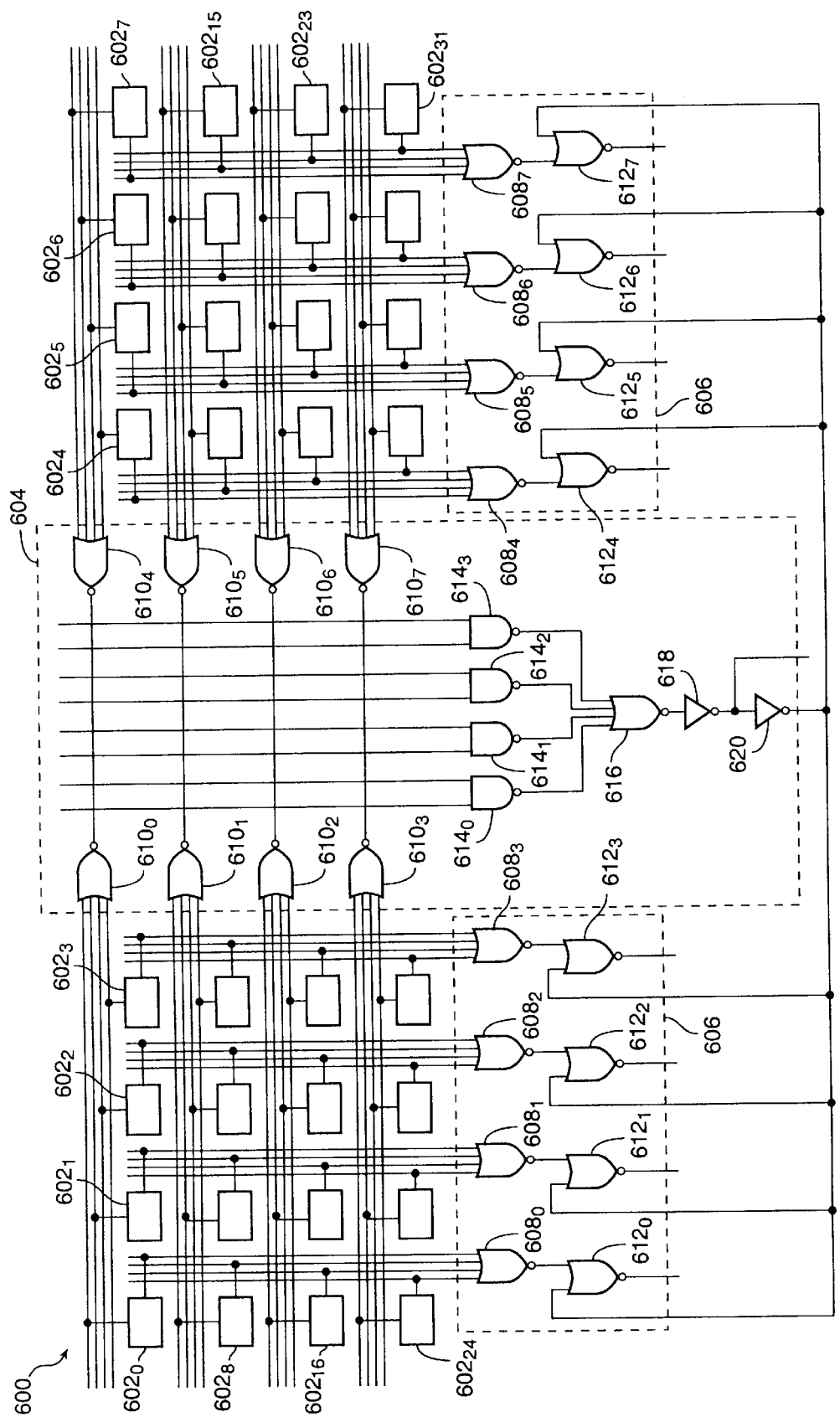
FIG. 6 depicts a schematic diagram of a fuse box according to an exemplary embodiment of the repair architecture of the present invention.

The present architecture is designed such that, for example, a first fuse box is assigned to a first redundant word line. If the first fuse box generates a repair signal, the first redundant word line is operated and the normal word line is not operated. FIG. 6 depicts row redundancy circuitry according to an exemplary embodiment of the repair architecture of the present invention. In the exemplary embodiment, the word lines in a given block have a hierarchical structure in which 4 or 8 sub-word lines are assigned to one main word line (MWL). Specifically, FIG. 6 depicts circuitry for a hierarchical structure having 4 sub-word lines. To select a given word line, a main word line, MWL, containing the given word line is selected and a sub-word line decoder produces sub-word line selecting signals pxz<0>, pxz<1>, pxz<2>, pxz<3> that select a given one of the 4 sub-word belong to the MWL. The sub-word line decoder generates signal px<0> to select a given normal word line belonging to a first sub-word line of a given MWL. If this word line has a defective cell, px<0> is deactivated and the normal word line is replaced with a redundant word line. The redundant word line is typically a sub-word line of a redundant main word line.

The fuse box array 600 contains fuse boxes $602_0$–$602_3$, arranged in four rows of eight fuse boxes. The circuitry depicted in FIG. 6 assumes a structure having 32 redundant word lines comprising 8 redundant MWL, each having 4 sub-word lines. Each of the fuse boxes $602_i$ assigns a redundant word line to a failed normal word line address, e.g. using laser blown fuses. If, for example, a selected address matches an address programmed into one of fuse boxes $602_i$, that fuse box generates a logical 1, otherwise the fuse box generates a logical 0. If, for example, all of the fuse boxes generate logical 0's, the selected address is normal, i.e. not failed, and the normal word line is enabled. If one of fuse boxes $601_i$ generates a logical 1, the selected address is defective and a redundant word line, assigned to fuse box $602_i$, is activated. The logical 1 and/or 0 signal parity is quite arbitrary, those skilled in the art will recognize that a different logic signal parity can be used to accomplish the same result.

Fuse box array 600 is configured to generate a normal word line enable signal nwex and a complementary redundant word line enable signal rwex. In the exemplary embodiment, a normal word line is enabled when nwex is a logical 0 and rwex is a logical 1. In FIG. 6, each fuse box in fuse box array 600 is wired to a set of normal NOR gates $608_0$–$608_7$ in main word line signal generator 604 and a set of redundant NOR gates $610_0$–$608_7$ in sub-word line signal generator 606.

The output signals of NOR gates $612_0$–$612_7$ (rxaz<0>–rxaz<7>) determine the redundant main word line. The output signals of NAND gates $614_0$–$614_3$ (rpxaz<0>–rpxaz<3>) determine the redundant sub word line. These are directly mapped to 8 redundant main word lines and 4 sub-word lines of each redundant word line, respectively. For example, fuse box $602_0$ is assigned to first redundant main word line (rxaz<0>) and first sub-word line of redundant main word line (rpxaz<0>), and fuse box 61013 is mapped to rxaz<5> and rpxaz<1>.

If any of the inputs of a NOR gate is, say a logical 1, the output of the NOR gate takes on a predetermined value. By way of example, NOR gates $608_i$, $610_i$ in FIG. 6 produce a logical 0 output if any of the four inputs is a logical 1 and a logical 1 output only when all four inputs are at a logical 0.

The outputs of NOR gates $608_0$–$608_7$ are connected to a first input of NOR gates $612_0$–$612_7$. The outputs of NOR gates 610 are connected to inputs of NAND gates $614_0$–$614_3$ that act as repair word line drivers. NAND gates $614_0$–$614_3$ produce, at their respective outputs, repair word line driver signals rpxaz<0>–rpxaz<3>. The outputs of NAND gates $614_0$–$614_3$ are connected to NOR gate 616. The output of NOR gate 616 is coupled to an inverter 618. The output of inverter 618 is coupled to an inverter 620. The output of inverter 618 provides normal word line enable signal nwex. The output of inverter 620 provides repair word line enable signal rwex. Repair word line enable signal rwex is coupled to a second input of each of NOR gates $612_0$–$612_7$. NOR gates $612_0$–$612_7$ produce repair word line address signals rxaz<0>–rxaz<7>. Thus, the binary value of repair address rxaz identifies the word line containing a defective cell.

Under normal conditions, all of fuse boxes $602_i$ generate logical 0's. All the inputs of NOR gates $608_i$ are logical 0's and NOR gates $608_i$ produce logical 1's. Furthermore, all of the inputs of NOR gates $610_i$ are normally logical 0's and NOR gates $610_i$ produce logical 1's. Consequently, all of NAND gates $614_i$ produce logical 0's as repair word line selection signals rpaxz<0>–rpaxz<3>, which means none of the sub word lines of a redundant main word line (RMWL) are activated. Consequently, the inputs of NOR gate 616 are all logical 0's. NOR gate 616 therefore produces a logical 1 at its output. As a result, inverter 618 produces a logical 0, and inverter 620 produces a logical 1. The end result is that normal word line enable signal nwex is driven low (i.e., a logical 0) and repair word line enable signal rwex is driven high (i.e., a logical 1), which means a normal word line must be activated. Thus, NOR gates $612_i$ receive logical 1's at both their inputs and thus produce logical 0's at repair address outputs rxaz<i> corresponding to redundant main word line <i>. In the embodiment depicted in FIG. 6, such a condition enables the normal word line and none of the repair word lines.

To understand how a repair address is assigned to a redundant word line, consider what happens fuse box $602_0$ matches a selected address. The given address signal is applied to all of the fuse boxes (not shown in FIG. 6), one of the fuse boxes, i.e., $602_0$, which is already programmed with the selected address generates a logical 1 signal and fuse boxes $602_1$–$602_7$ generate logical 0's. The inputs of NOR 6100 receive a logical 1 from fuse box $602_0$ and produce a logical 0. The inputs of NOR $610_1$–$610_3$ receive logical 0's and these NOR gates produce logical 1's. Consequently, NAND gate $614_0$ produces a logical 1 as rpxaz<0>, but NAND gates $614_1$–$614_3$ produce logical 0's as rpxaz<1>–rpxaz<3>. NOR 616 therefore produces a logical 0. As a result, inverter 618 produces a logical 1, and inverter 620 produces a logical 0.

Furthermore, the inputs of NOR gates $608_1$–$608_7$ are all logical zeros and these NOR gates produce logical 1's. The end result is that normal word line enable signal nwex is driven high (i.e., a logical 1) and repair word line enable signal rwex is driven low (i.e., a logical 0). Thus, a normal word line is disabled and a repair word line is enabled. Consequently, both inputs of NOR gate $612_0$ receive logical 0's and produce a logical 1 at output rxaz<0>.

By contrast, NOR gates $612_1$–$612_7$ receive logical 1's at both inputs and produce logical 0's at repair address outputs rxaz<1>–rxaz<7>, corresponding to a first repair main word line. Output rpxaz<0> which is a logical 1 as described above, combines with a logical 1 at rxaz<0> to generate a first redundant main word line and its first sub word line. The normal word line is disabled since nwex is high. Other redundant related circuitry is enabled when rwex is active low, i.e., a logical 0. Any other programmed fuse box matched with a defective input address similarly generates corresponding rxaz<i>, rpxaz<i> signals, which result in direct mapping of the fuse box with a redundant word line.

Those skilled in the art will recognize that a Y-fuse box and repair circuitry having features in common with that of FIG. 6 may be used to implement column redundancy.

In the repair scheme of FIG. 6, it does not matter where a defective cell is located. In principle, any available redundant word line may replace a defective cell. If any of the fuse boxes connected to a given redundant word line driver is blown, then that redundant word line is enabled and the normal word line is disabled. If a given redundant word line is defective, then the fuse boxes connected to that redundant word line driver are simply not used. For example, if the repair word line driven by output rpxaz<0> and rxaz<0> is in some way defective, fuse box $602_0$ would simply not be used. If a fuse box is defective that fuse box simply isn't used and a different one is used instead.

Figure 7:
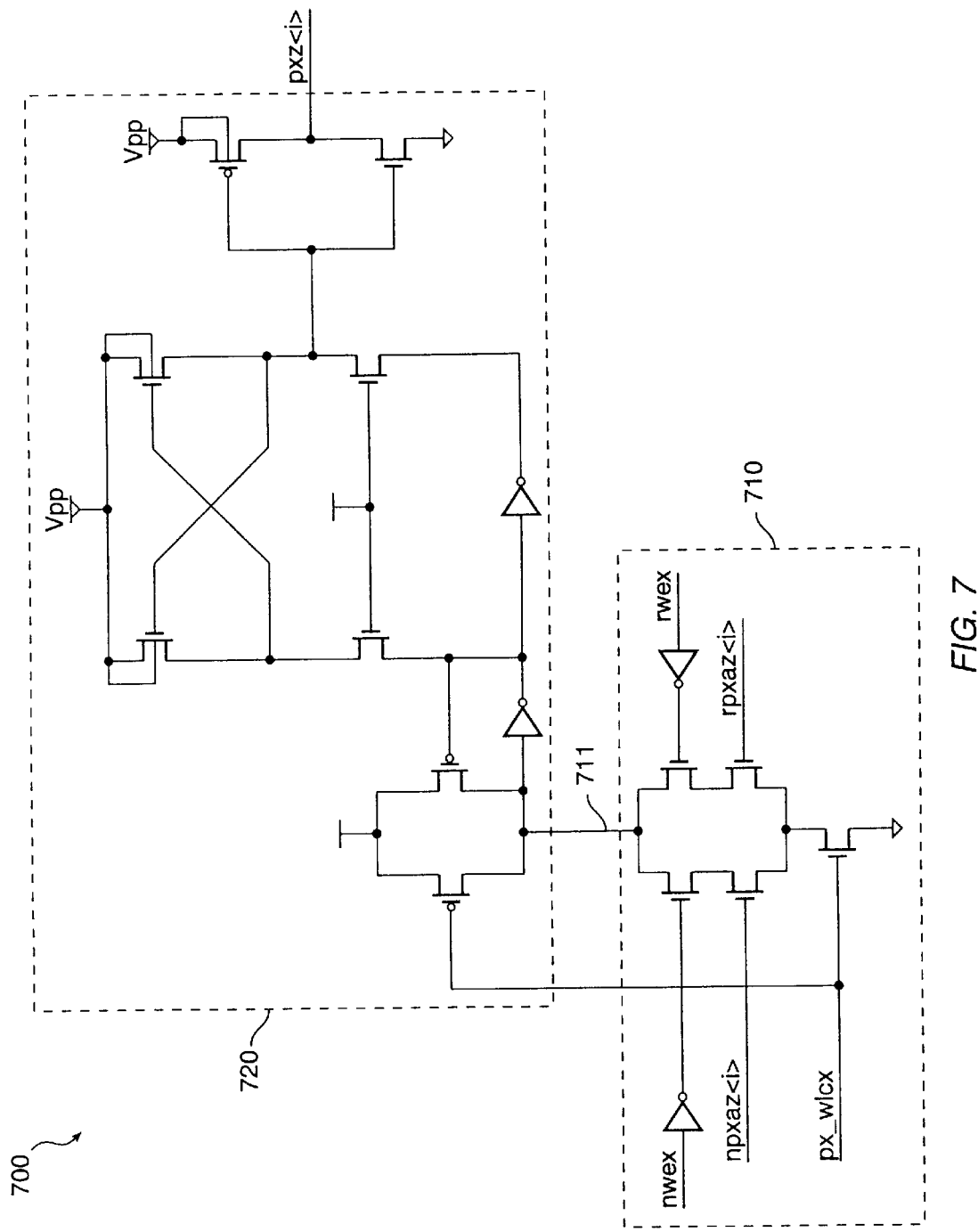
FIG. 7 depicts an embodiment of an exemplary circuit for generating sub-word line selection signals within a special block of memory cells according to the present invention.

In the architecture of the present invention, at least one block, e.g. special block $502_{15}$ in FIG. 5, contains both normal cells and repair cells. If redundant word lines are located in the same block as normal ones, two word line selection paths are needed, one for normal word line selection and one for redundant word line selection. Another aspect of the architecture of the present invention provides circuitry for such repair and normal word line selection within a block of memory cells containing both normal and redundant memory cells. FIG. 7 depicts an embodiment of a circuit 700 for generating a normal or redundant sub-word line selection signal within a special block, such as block $502_{15}$ of FIG. 5. By way of example, four such circuits of may be located beside special block $502_{15}$ as shown in FIG. 5.

Block 710 receives inputs from normal word line enable signal nwex, a normal address signal npxaz, normal word line enable signal nwex, a timing signal px_wlcx, redundant word line enable signal rwex and repair address signal rpxaz. Block 710 produces an output 711. Block 720 receives timing signal px_wlcx and output 711 and generates normal sub-word line selection signal pxz. Circuit 700 is configured to avoid a sub word line selection problem. For example, if the selected address of a normal word line corresponds to the second sub word line, pxz<1> is activated. But if the selected address is defective and mapped to a redundant word line corresponding to the third sub word line, pxz<2> is activated instead of pxz<1>. Here, npxaz<0>–npxaz<3>are normal sub word line enable signals that are generated by an address decoder.

Normal and redundant word line enable signals nwex and rwex, and repair address signal rpaxz, may be generated by a fuse box, such as that as described above with respect to FIG. 6. Timing signal px_wlcx may be generated by a timing circuit or similar circuit to synchronize the generation of sub-word line selection signal pxz. Normal word line address signal npaxz may be received, for example, from an address decoder such as X-address decoder array $508_X$ of FIG. 5. Normal word line enable signal nwex, normal word line address signal npaxz, timing signal px_wlcx are coupled to gates of transistors 701, 702, and 703 respectively. In the embodiment depicted in FIG. 7, normal word line enable signal nwex is coupled to transistor 701 via inverter 704. Recall that in FIG. 6 nwex is a logical 0 if a repair word line is not used. Similarly, repair word line enable signal rwex is coupled to an inverter 705. Recall that in FIG. 6 rwex is a logical 0 if a repair word line is to be used. In the example shown in FIG. 7, sub-word line selection signal pxz<i> is generated if timing signal px_wlcx is a logical 1 and either nwex is a logical 0 and npxaz<i> is a logical 1, or rwex is a logical 0 and rpxaz<i> is a logical 1. Thus, sub-word line selection signal pxz<i> is generated whether the special block $502_{15}$ is operated to access normal memory cells or a redundant memory cells.

A structure containing four sub word line for each main word line structure, typically requires four circuits 700 to generate four sub word line activation signal pxz<0>–pxz<3>. An eight sub word line structure would require, for example, eight pxz<i> signals and, therefore, eight circuits 700. The sub word line selection problem happens only in a special block that contains both normal cells and redundant cells. Hence, this circuitry is normally used only in such a special block.

The repair architecture described above can be incorporated into any type of memory device. Embodiments for the apparatus and method of the present invention may be employed in a memory device such as a random access memory (RAM), dynamic random access memory (DRAM), or synchronous dynamic random access memory (SDRAM). One example of an embodiment of a memory device that incorporates the repair scheme of the present invention is a 256 Megabyte synchronous DRAM (SDRAM). This particular embodiment contains 8 half-banks divided up in to 16 blocks each.

The redundancy architecture of the present invention implements repair during read or write operations according to an inventive method. The steps of the method are illustrated in the embodiment depicted in the flow diagram of FIG. 8. In the method 800, a selected memory block, such as any of blocks $502_i$ of FIG. 5, is operated whether the selected word line needs repair or not without waiting for a comparison signal from a fuse box array of such as that depicted in FIG. 6. A special memory block, such as block $502_{15}$ containing both normal memory cells and one or more redundant word lines, is always operated as if it is selected. Recall that a block equalizer keeps the blocks in a pre-charge state in between read/write operations. The method starts at step 802 when a block equalizer connected to a block containing a selected word line is turned off and the bit line of the selected block is connected to a sense amp. If, at step 804, the selected word line is determined to be within the special block, only the special block is selected at step 806. Otherwise both normal block and the special block are selected at step 808. In step 810 a row decoder compares the row (i.e., word line) address with data from the fuse boxes. If the fuse box data indicates that the selected word line is normal, the special block goes to a pre-charge state at step 812. A read or write operation may then be performed on the normal address at step 813. If the comparison signal indicates that the selected word line is defective, the normal block goes to a pre-charge state at step 814. A read or write operation may then be performed at step 815. The method then determines at step 816 whether to start over at step 802 to operate on another address or end at step 818.

Figure 8:
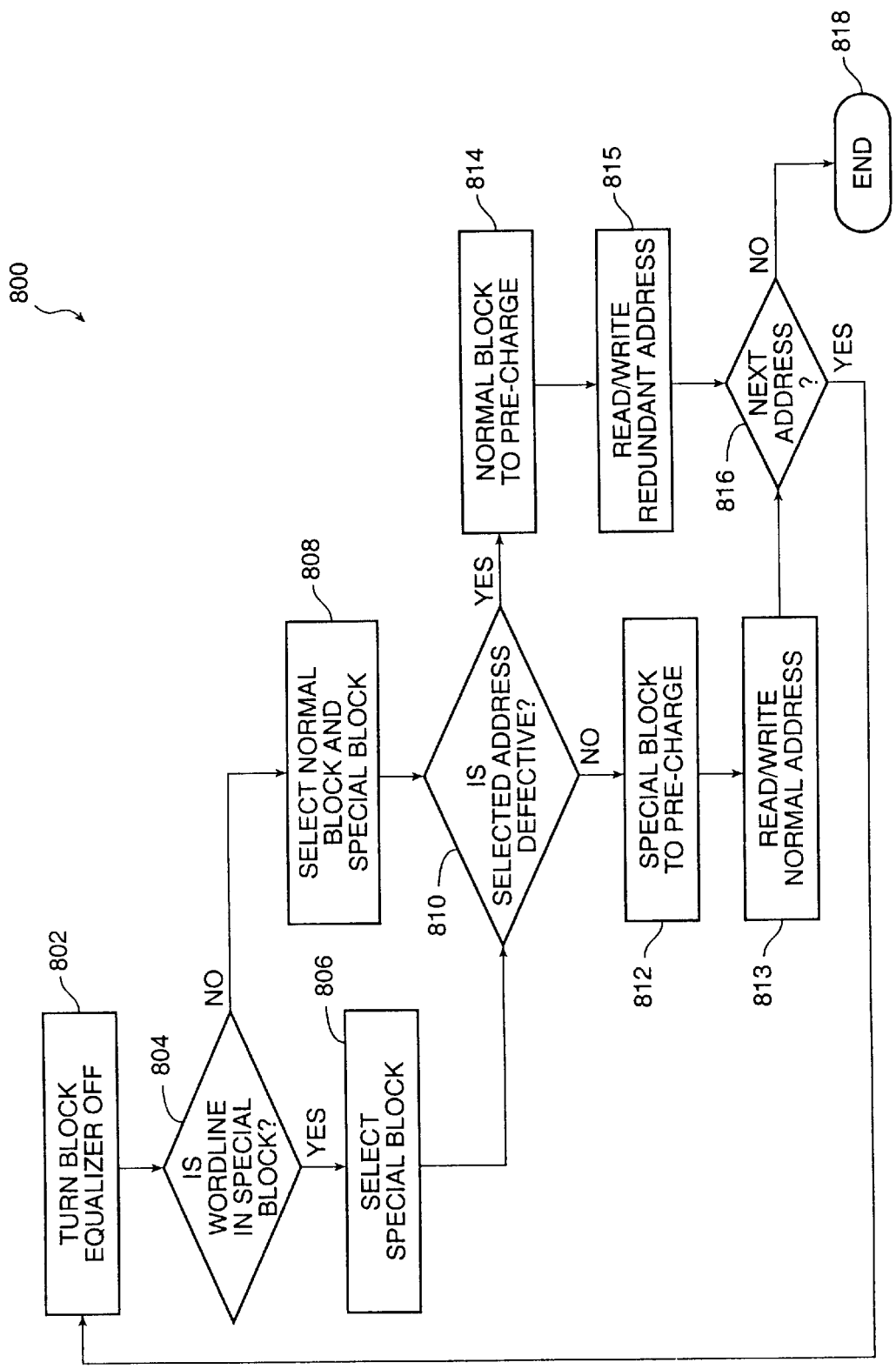
FIG. 8 depicts an embodiment of a method for implementing a repair of a memory device according to the present invention.

Note that, in the embodiment of the method depicted in FIG. 8, if a block adjacent the special block is selected, there is no problem since the special block does not share a sense amp with any adjacent blocks. Since the special block is always turned on, toggling of the sense amps and consequent current is greatly reduced. Also, since block address data generally need not be decoded, global redundancy may be more readily implemented.

Furthermore, embodiments of the method and device of the present invention provides global redundancy architecture for memory circuits that provides efficient repair of defective memory cells. Specifically, defective cells may be repaired in any block in a given bank. The only limitation on the number of cells that may be repaired is the number of fuse boxes available. Furthermore, the repair architecture of embodiments of the present invention allows for replacement of defective redundant word lines and defective fuse boxes.

While the above is a complete description of specific embodiments of the present invention, various modifications, variations, and alternatives may be employed. The scope of this invention, therefore, should not be limited to the embodiments described, and should instead be defined by the following claims.

What is claimed is:

1. A memory device with global redundancy, comprising:
   a plurality of blocks of memory each having an array of normal memory cells, one block of the plurality of blocks being a special block, the special block further having an array of redundant memory cells; and
   a plurality of banks of sense amplifiers disposed adjacent the plurality of blocks of memory and coupled to the plurality of blocks of memory such that except for the special block, other blocks in the plurality share a bank of sense amplifiers with an adjacent block, wherein, the special block couples to a dedicated bank of sense amplifiers and, wherein, the redundant memory cells can replace defective normal memory cells in any one of the plurality of memory blocks.

2. The memory device of claim 1, wherein the plurality of redundant memory cells in the special block are arranged in a plurality of redundant word lines and the plurality of normal cells in each of the blocks and the plurality of normal cells in the special block are arranged in a plurality of normal word lines.

3. The memory device of claim 2, wherein said plurality of normal wordlines comprises a first plurality of natural main word lines and a second plurality of normal sub-word lines.

4. The memory device of claim 2, wherein said plurality of redundant wordlines comprises a first plurality of redundant main word lines and a second plurality of redundant sub-word lines.

5. The memory device of claim 2, further comprising a plurality of fuse boxes, wherein each fuse box in the plurality of fuse boxes is configured to selectively assign a defective address located in any of the blocks of memory to a selected one of the redundant word lines in the special block.

6. The memory device of claim 2, further comprising a plurality of bit lines configured such that an address of each of the normal memory cells corresponds to an intersection between one of the bit lines and one of the normal word lines and an address of each of the redundant memory cells corresponds to an intersection between one of the bit lines and one of the redundant word lines.

7. The memory device of claim 6, further comprising a bit line decoder coupled to the plurality of bit lines, wherein the special block is situated closer to the bit line decoder than any of the other blocks of memory in the plurality of blocks.

8. The memory device of claim 2, further comprising:

a word line address decoder coupled to the plurality of normal word lines or the plurality of redundant word lines or both said plurality of normal word lines and the plurality of redundant word lines.

9. The memory device of claim 1, further comprising:

a plurality of block equalizers, wherein each block equalizer is connected to at least one block of memory in the plurality of blocks of memory.

10. The memory device of claim 1, wherein said memory device is a synchronous dynamic random access memory (SDRAM).

11. The memory device of claim 10, wherein said synchronous dynamic random access memory is a 256 Megabyte SDRAM.

12. A method of operating a memory device with global redundancy, comprising:

providing a plurality of blocks of memory each block having an array of normal memory cells, one block of the plurality of blocks being a special block, the special block further having an array of redundant memory cells; and coupling a plurality of banks of sense amplifiers to the plurality of blocks of memory such that except for the special block, other blocks in the plurality share a bank of sense amplifiers with an adjacent block.

13. The method of claim 12, wherein a block equalizer, connected to at least one of said plurality of normal blocks is turned off prior to said coupling.

14. The method of claim 12, wherein a block equalizer connected to said special block is turned off prior to said coupling.

15. The method of claim 12, further comprising: performing a read operation or a write operation on a memory cell in the special block.

16. The method of claim 12, further comprising: performing a read operation or a write operation on a memory cell in a selected normal block.

17. A method of operating a memory device having a plurality of normal blocks of memory cells and a special block of memory cells, the special block further having a plurality of redundant cells, the method comprising:

decoding an input address signal;

activating the special block;

determining whether the input address selects a block other than the special block;

if the input address selects a block other than the special block, activating a selected normal block; and determining whether the decoded address includes a defective memory cell.

18. The method of claim 17, further comprising:

if the decoded address includes a defective memory cell, setting the normal block to a pre-charge state; and performing a read or write operation on one or more of the redundant memory cells in the special block.

19. The method of claim 17 further comprising:

if the decoded address does not include a defective memory cell, setting the special block to a pre-charge state; and performing a read or write operation on one or more of the normal memory cells in the selected normal block.

* * * * *

UNITED STATES PATENT AND TRADEMARK OFFICE
CERTIFICATE OF CORRECTION

Figure 3A:
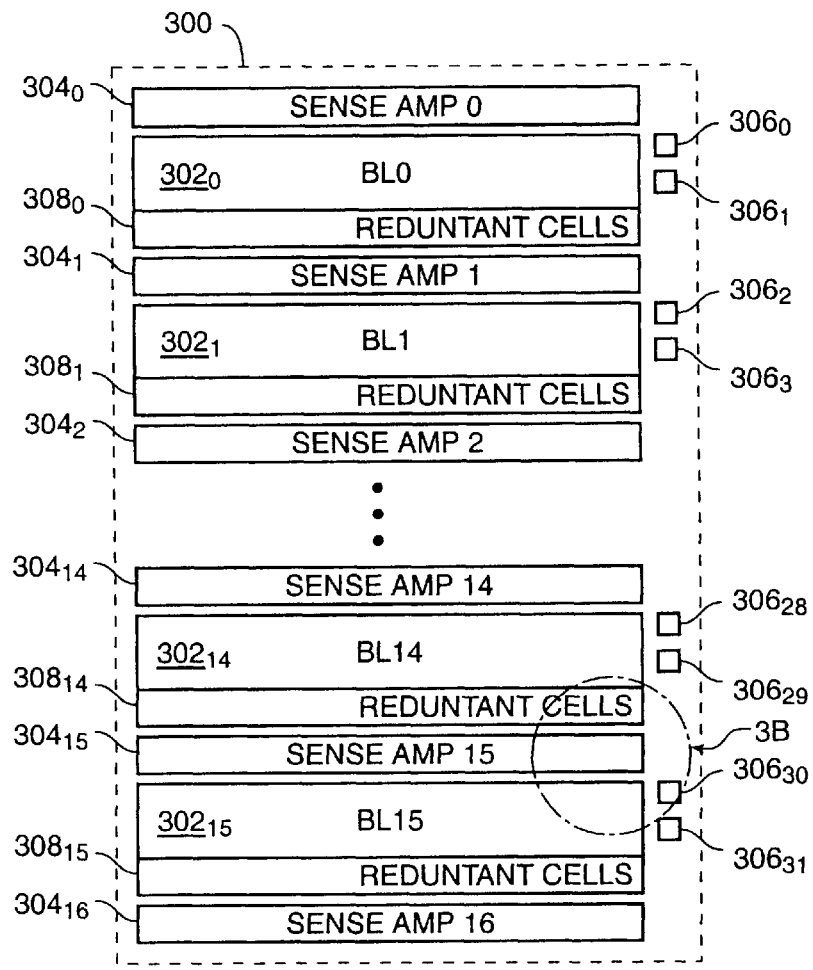
FIG. 3(a)–3(b) depict a block diagram of a DRAM exhibiting a local repair architecture according to the prior art.
Figure 3B:
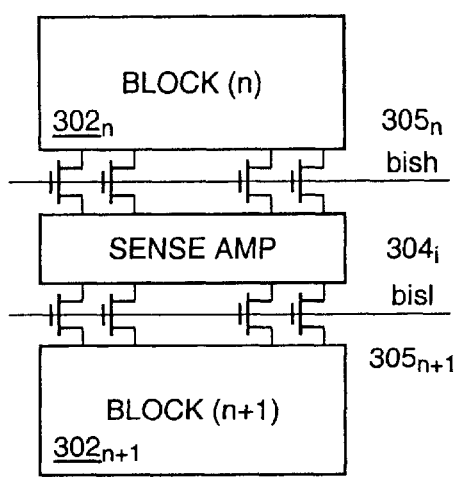
Figure 4:
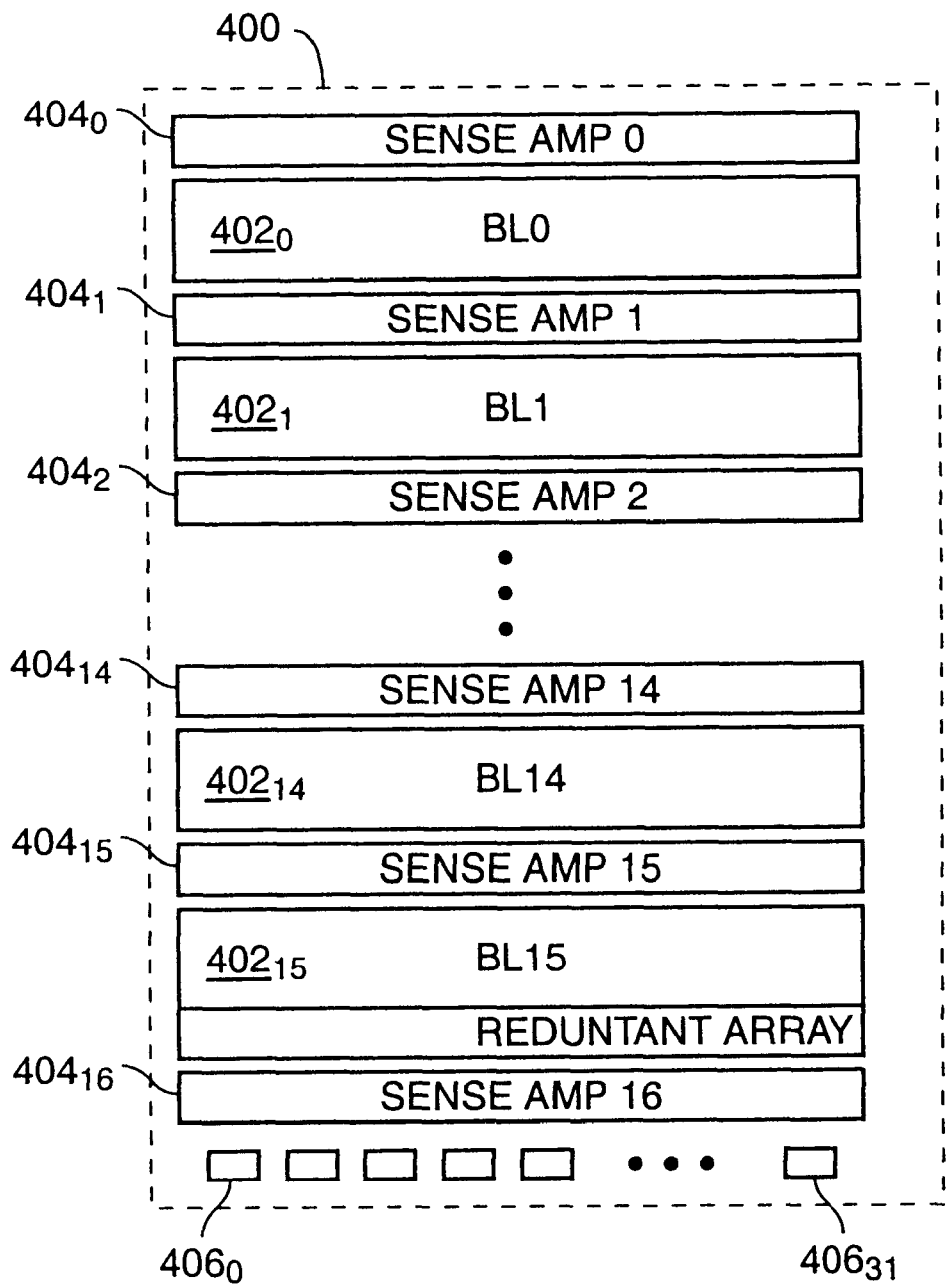
FIG. 4 depicts a block diagram of a DRAM exhibiting a global repair architecture according to the prior art.

PATENT NO.    : 6,084,807   Page 1 of 1
DATED         : July 4, 2000
INVENTOR(S)   : Choi It is certified that error appears in the above-identified patent and that said Letters Patent is hereby corrected as shown below:

<u>Drawings,</u>
Figs. 3a, 3b and 4 should be labeled as -- PRIOR ART --.

<u>Column 11,</u>
Line 15, "natural" should be -- normal --.

Signed and Sealed this

Sixteenth Day of March, 2004

JON W. DUDAS
*Acting Director of the United States Patent and Trademark Office*